US010103243B2

(12) United States Patent
Cheng et al.

(10) Patent No.: US 10,103,243 B2
(45) Date of Patent: Oct. 16, 2018

(54) UNIPOLAR SPACER FORMATION FOR FINFETS

(71) Applicant: INTERNATIONAL BUSINESS MACHINES CORPORATION, Armonk, NY (US)

(72) Inventors: Kangguo Cheng, Schenectady, NY (US); Peng Xu, Guilderland, NY (US); Jie Yang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/611,122

(22) Filed: Jun. 1, 2017

(65) Prior Publication Data
US 2018/0026114 A1 Jan. 25, 2018

Related U.S. Application Data

(63) Continuation of application No. 15/216,189, filed on Jul. 21, 2016, now Pat. No. 9,812,553.

(51) Int. Cl.
H01L 29/66 (2006.01)
H01L 21/3213 (2006.01)
H01L 29/78 (2006.01)
H01L 21/311 (2006.01)
H01L 21/308 (2006.01)

(52) U.S. Cl.
CPC ........ H01L 29/6656 (2013.01); H01L 21/308 (2013.01); H01L 21/31111 (2013.01); H01L 21/32139 (2013.01); H01L 29/66795 (2013.01); H01L 29/785 (2013.01)

(58) Field of Classification Search
CPC .......... H01L 29/3356; H01L 29/66795; H01L 21/308; H01L 21/31111
See application file for complete search history.

(56) References Cited

U.S. PATENT DOCUMENTS

| 5,763,301 | A | 6/1998 | Rha et al. |
| 6,683,342 | B2 | 1/2004 | Lin |
| 6,727,543 | B2 | 4/2004 | Lin |
| 7,968,409 | B2 | 6/2011 | Seliskar |
| 8,384,156 | B2 | 2/2013 | Ma et al. |
| 8,574,970 | B2 | 11/2013 | Cheng et al. |
| 9,136,179 | B2 | 9/2015 | Zhang |

(Continued)

FOREIGN PATENT DOCUMENTS

| KR | 1997-0024317 A | 5/1997 |
| TW | 201435986 A | 9/2014 |

OTHER PUBLICATIONS

List of IBM Patents or Patent Applications Treated as Related dated Jun. 1, 2017, 2 pages.

Primary Examiner — Dung Le
(74) Attorney, Agent, or Firm — Tutunjian & Bitetto, P.C.; Vazken Alexanian

(57) ABSTRACT

A semiconductor device includes semiconductor fins formed on a substrate, gate structures formed transversely over the fins, unipolar spacers formed over the gate structures only, and source and drain regions formed between the gate structures on the fins. The fins are free from the unipolar spacers, and the unipolar spacers have a substantially uniform thickness vertically along the gate structures and include a spacer material with an etch selectivity greater than SiN for oxide removal.

13 Claims, 9 Drawing Sheets

(56) References Cited

U.S. PATENT DOCUMENTS

| | | |
|---|---|---|
| 2007/0080409 A1 | 4/2007 | Seliskar |
| 2015/0380514 A1* | 12/2015 | Bentley .............. H01L 29/6656 257/346 |
| 2016/0099244 A1* | 4/2016 | Ho ..................... H01L 29/7848 257/401 |
| 2016/0126338 A1 | 5/2016 | Zhao |
| 2016/0359021 A1* | 12/2016 | Kim ................. H01L 29/66795 |

* cited by examiner

UNIPOLAR SPACER FORMATION FOR FINFETS

CROSS REFERENCE TO RELATED APPLICATIONS

Background

Technical Field

The present invention generally relates to semiconductor processing, and more particularly to devices and methods having a unipolar spacer to better protect fins and surrounding materials during etch processes.

Description of the Related Art

With the continued scaling down of complementary metal oxide semiconductor (CMOS) devices, narrower dimensions begin to cause additional challenges. For example, cladding epitaxy is needed for channel strain retention. Cladding epitaxy for an epitaxial region surrounds fins employed in fin field effect transistor (finFET) devices. Since pitches between structures are smaller, spacers formed on sidewalls of the gate structures are easier to pinch-off in the fin regions. This means that the spacer material does not get all the way to the base of the fins. This leads to fin erosion (e.g., fin height erosion) and erosion (e.g., gouging) of shallow trench isolation regions (STIs) at or near the base of the fins due to spacer etch back around the fin. This also results in leaving spacer residue, which blocks epitaxial growth of the cladding epitaxy that forms source and drain regions.

SUMMARY

In accordance with an embodiment of the present principles, a method for forming a spacer for a semiconductor device includes patterning gate material in a transverse orientation relative to semiconductor fins formed on a substrate and conformally depositing a dummy spacer layer over surfaces of gate structures and the fins. A dielectric fill formed over the gate structures and the fins is planarized to remove a portion of the dummy spacer layer formed on tops of the gate structures and expose the dummy spacer layer at tops of the sidewalls of the gate structures. Channels are formed by removing the dummy spacer layer along the sidewalls of the gate structures. The fins are protected by the dielectric fill. A spacer is formed by filling the channels with a spacer material. The dielectric fill and the dummy spacer layer are removed to expose the fins. Source and drain regions are formed between the gate structures on the fins.

A method for forming a spacer for a semiconductor device including forming semiconductor fins by etching a substrate; forming a shallow trench isolation region at a base of the fins; depositing gate material over the fins and patterning the gate material in a transverse orientation relative to the fins; conformally depositing a dummy spacer layer over surfaces of gate structures and the fins, the dummy spacer layer being pinched-off to leave a void remaining in between at the base of the fins; depositing a dielectric fill over the gate structures and the fins; planarizing the dielectric fill to remove a portion of the dummy spacer layer formed on tops of the gate structures and expose the dummy spacer layer at tops of the sidewalls of the gate structures; forming channels by removing the dummy spacer layer along the sidewalls of the gate structures, the fins being protected by the dielectric fill; forming a spacer by filling the channels with a spacer material; removing the dielectric fill and the dummy spacer layer to expose the fins; and forming source and drain regions between the gate structures on the fins.

A semiconductor device includes semiconductor fins formed on a substrate, and gate structures formed transversely over the fins. Unipolar spacers are formed over the gate structures only. The fins are free from the unipolar spacers. The unipolar spacers have a substantially uniform thickness vertically along the gate structures and include a spacer material with an etch selectivity greater than SiN for oxide removal. Source and drain regions are formed between the gate structures on the fins.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
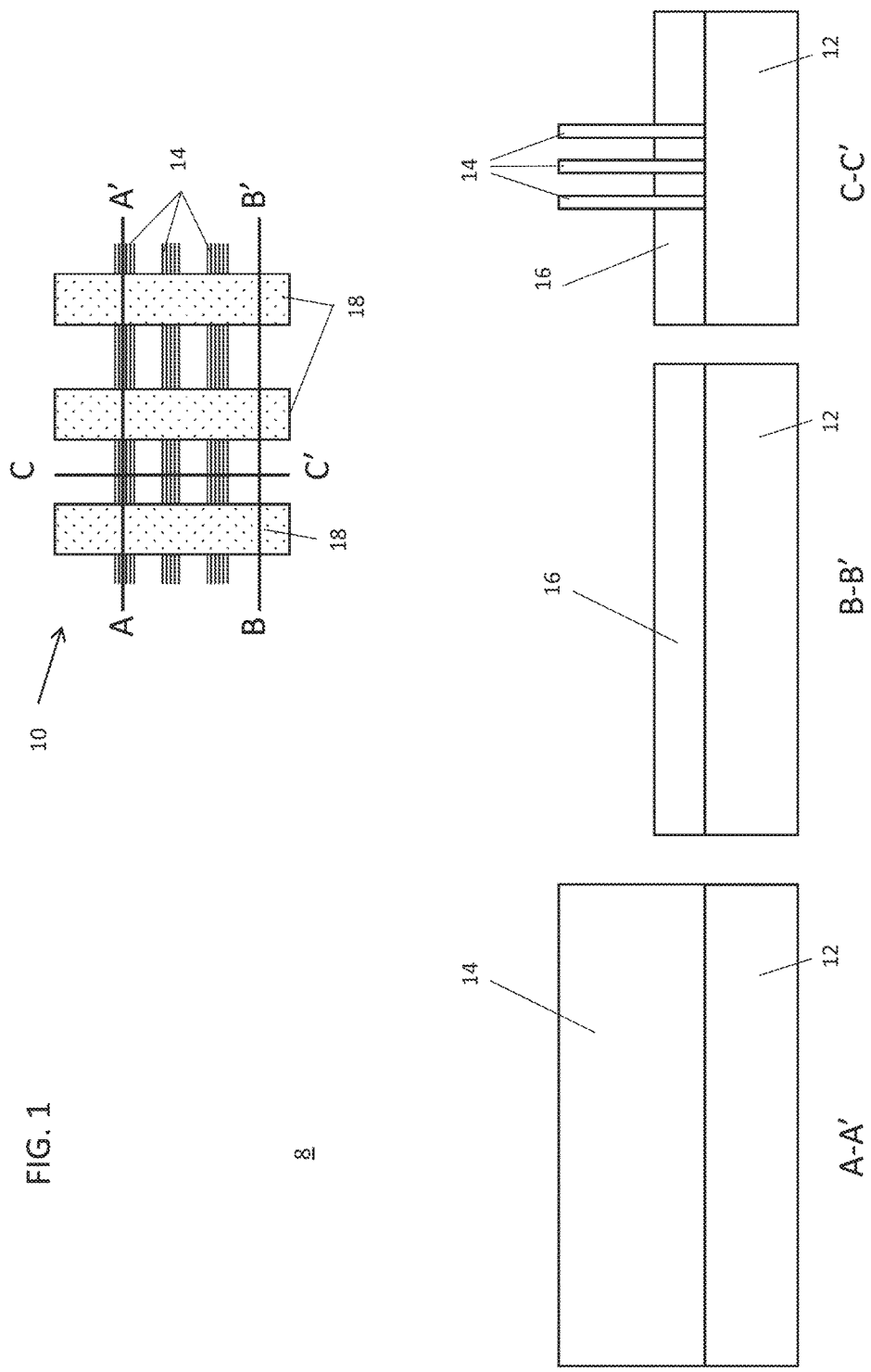
FIG. 1 is a plan view with section lines A-A', B-B' and C-C' and cross-sectional views corresponding to the section lines depicting formation of fins and a shallow trench isolation region in accordance with the present principles.

In accordance with the present principles, methods, devices and structures are disclosed that form a unipolar spacer (e.g., on sides of a gate structure only to avoid fin and shallow trench isolation (STI) erosion). In accordance with useful embodiments, methods provide for the formation of epitaxial cladding on fins that are well preserved. Erosion of the fins is prevented or reduced during spacer etch back. In addition, shallow trench isolation regions are protected to prevent gouging during spacer etch back. Epitaxial growth on the fins is improved by maintaining cleaner fin surfaces by avoiding spacer residue on the fins. In one embodiment, a spacer layer is formed, vertical portions of the spacer layer are removed and replaced with a high etch resistance material. The spacer is unipolar in that it extends in a single direction along the gate structures and not along the fin structures, which are perpendicular to the gate structures. In a particularly useful embodiment, fin pitch is smaller than gate pitch.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath"

other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a plan view 10 schematically shows a layout of a partially fabricated semiconductor device 8. The device 8 includes fins 14 and gate structures 18 disposed transversely (e.g., orthogonal) to each other. The plan view 10 includes three sections, A-A', B-B' and C-C'. Each section has a corresponding cross-sectional view labeled A-A', B-B' and C-C', respectively.

In FIG. 1, a semiconductor substrate 12 may include a bulk-semiconductor substrate. In one example, the bulk-semiconductor substrate 12 may be a silicon-based material. Illustrative examples of Si-based materials suitable for the bulk-semiconductor substrate 12 include, but are not limited to, Si, SiGe, SiGeC, SiC, etc. and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride, zinc sellenide, etc. Although not depicted in FIG. 1, the semiconductor substrate 12 may also be a semiconductor on insulator (SOI) substrate.

Fins 14 may be etched into the substrate 12 by employing a lithographic patterning process, a spacer image transfer process, (e.g., self-aligned quadruple patterning (SAQP) or a self-aligned double patterning (SADP)), etc. to form an etch mask and then etch the substrate 12 using, e.g., a reactive ion etch (RIE) process. The fins 14 are etched to a desired depth.

A dielectric layer 16 is deposited over the fins and recessed by a recess etch process to form a shallow trench isolation region 16. The dielectric layer 16 may include an oxide, although other suitable dielectric materials may be employed. The dielectric layer 16 may be formed by a blanket deposition process using, e.g., chemical vapor deposition (CVD) or other suitable processes. In an alternate embodiment, the blanket deposition of dielectric layer 16 is followed by a planarization process (e.g., chemical mechanical polishing (CMP)). Then, a fin reveal etch (selectively etched relative to the substrate/fin material) is performed to expose the fins 14.

Section A-A' of FIG. 1 shows a cross-section taken through a middle of the fin 14. Section B-B' of FIG. 1 shows a cross-section taken through the substrate 12 and the STI 16. Note that gate structures 18 have not yet been formed in the process depicted with the cross-sections A-A', B-B' and C-C' of FIG. 1 and are depicted in plan view 10 to provide an understanding of structure positions. Section C-C' of FIG. 1 shows a cross-section taken through the substrate 12, fins 14 and the STI 16.

Figure 2:
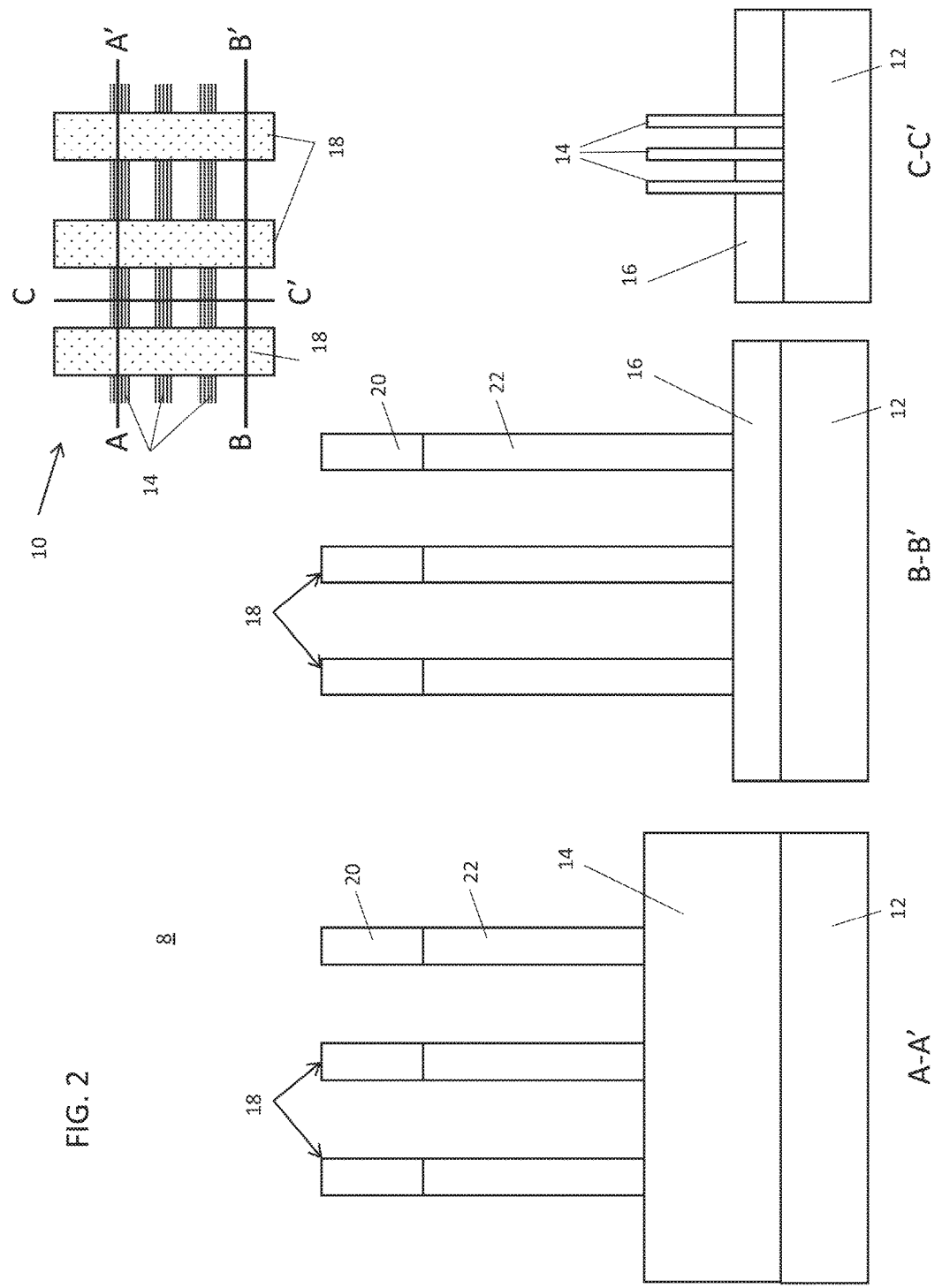
FIG. 2 is a plan view with section lines A-A', B-B' and C-C' and cross-sectional views corresponding to the section lines showing a structure of FIG. 1 with gate structures formed thereon in accordance with the present principles.

Referring to FIG. 2, a gate formation is performed to provide gate structures 18. The gate formation process may include a gate first process or a replacement gate or gate last process. In a gate first process, gate materials are formed and patterned that will be employed as the actual gate. In a gate last process, a dummy gate is formed and then later removed and replaced by permanent gate materials.

A gate material 22 is deposited and patterned using lithography, SADP, etc. and etching (e.g., RIE). A hardmask 20 may be deposited on the gate materials 22 and patterned along with the gate materials 22. The hardmask 20 may include a suitable dielectric material, such as, e.g., silicon nitride or silicon oxynitride.

The gate materials 22 may include polysilicon or amorphous silicon if a dummy gate is employed for a gate last/replacement gate structure. The gate materials 22 may include a gate conductor (22), such as, e.g., polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials.

Figure 3:
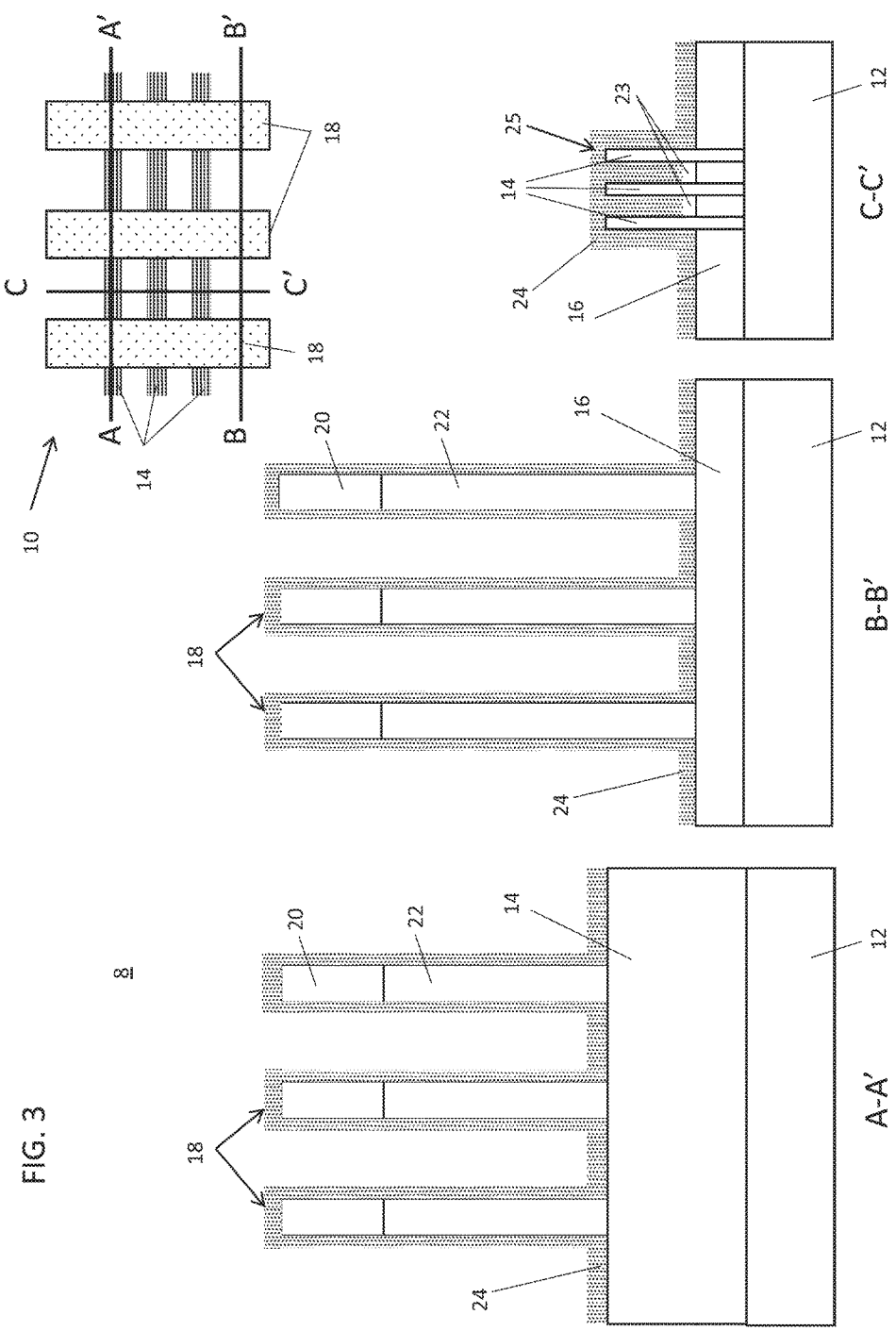
FIG. 3 is a plan view with section lines A-A', B-B' and C-C' and cross-sectional views corresponding to the section lines showing the structure of FIG. 2 with a dummy spacer layer conformally formed over the gate structures and the fins in accordance with the present principles.

Referring to FIG. 3, a conformal layer or dummy spacer 24 is conformally deposited over all surfaces of the device 8. The conformal layer 24 may include a thin coating having a thickness of between about 2 nm to about 10 nm. The conformal layer 24 may be deposited using a CVD process, an atomic layer deposition (ALD) process or any other suitable conformal deposition process. The conformal layer 24 may include amorphous carbon (aC) or other materials that can be selectively etched relative to surrounding materials.

The fins 14 include a narrow enough pitch that may cause the conformal layer 24 to pinch off between the fins 14. This may include the formation of a void, space or pinch-off region 23 between the conformal layer 24 and the STI 16. The space 23 may be employed to more easily remove the conformal layer 24 in later steps. The conformal layer 24 uses the pinch-off to form a block 25 over the fins 14 to protect the fins 14 during subsequent processing.

Figure 4:
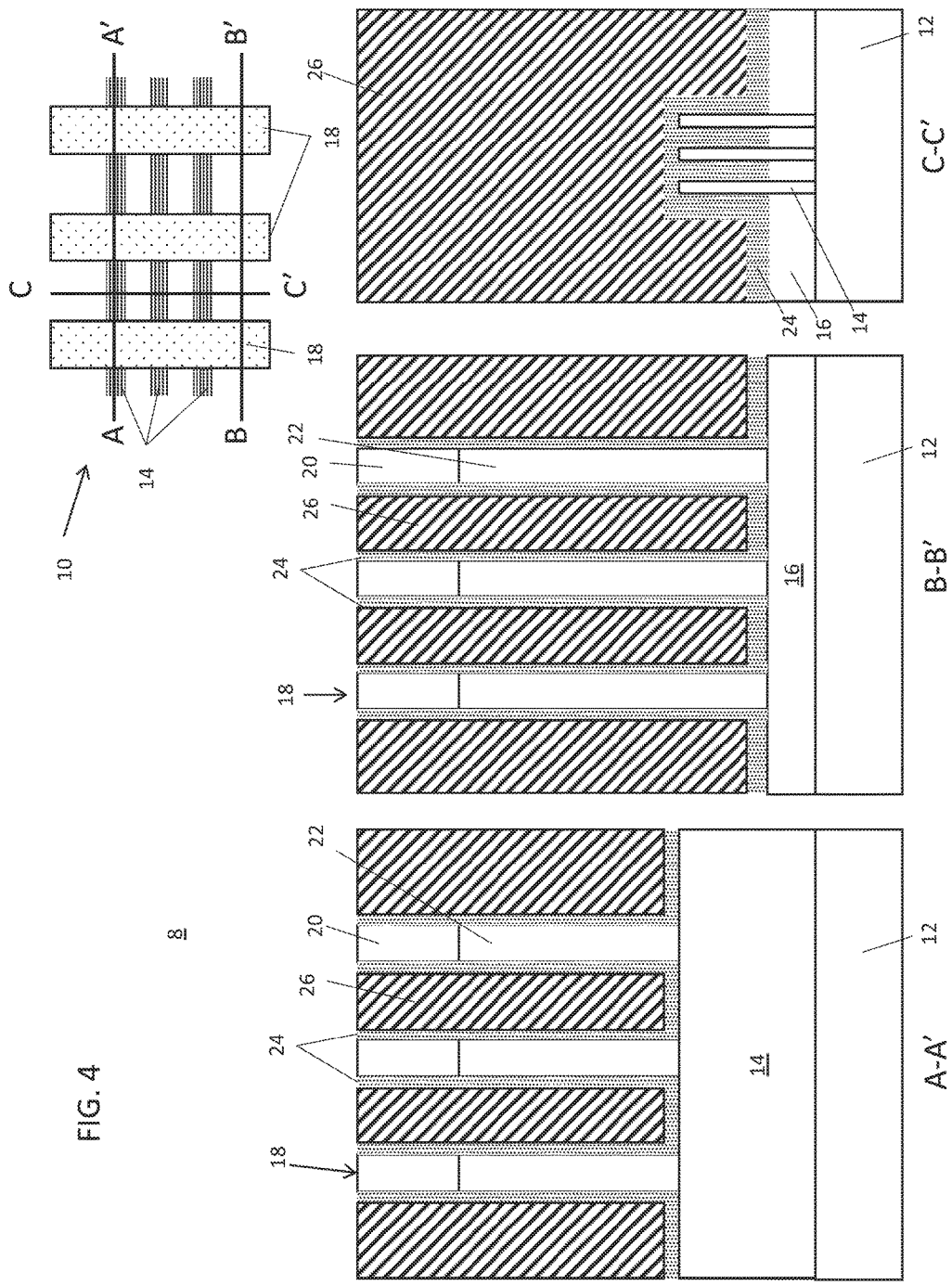
FIG. 4 is a plan view with section lines A-A', B-B' and C-C' and cross-sectional views corresponding to the section lines showing the structure of FIG. 3 with a dielectric fill formed and planarized to expose vertical portions of the dummy spacer layer on sidewalls of the gate structures in accordance with the present principles.

Referring to FIG. 4, a dielectric fill 26 is applied to the device 8. The dielectric fill 26 fills in between gate structures 18 and covers the block 25 of the fins 14. The dielectric fill 26 may include an oxide, such as a silicon oxide or may include polysilicon. Other materials may also be employed.

A planarization process, e.g., CMP is performed. The planarization process removes dielectric fill 26 from a top surface and removes a top portion of the dummy spacer 24 to expose the hardmask 20. Vertical portions of the dummy spacers 24 are also exposed to be etched in subsequent steps.

Figure 5:
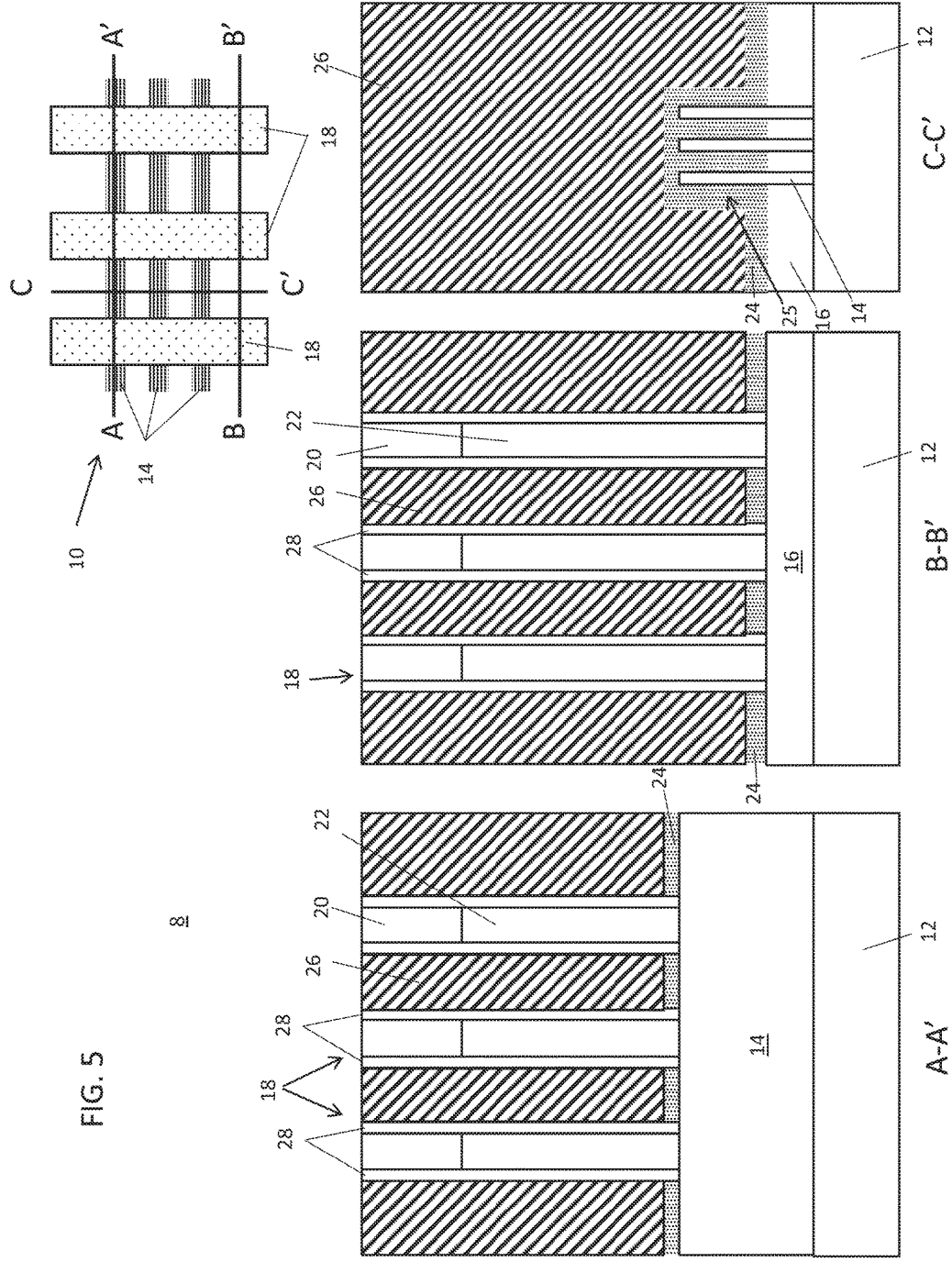
FIG. 5 is a plan view with section lines A-A', B-B' and C-C' and cross-sectional views corresponding to the section lines showing the structure of FIG. 4 with the vertical portions of the dummy spacer layer on sidewalls of the gate structures removed to form channels in accordance with the present principles.

Referring to FIG. 5, an etch process, such as, e.g., RIE is employed to selectively etch away the dummy spacer 24 from the sidewalls of the hardmask 20 and the gate material 22. The dummy spacer 24 is removed down to the fin 14 in section A-A', and down to the STI 16 in section B-B'. The block 25 is protected by the dielectric fill 26 in section C-C'. The etch process forms open channels 28 along sidewalls of the gate structures 18.

Figure 6:
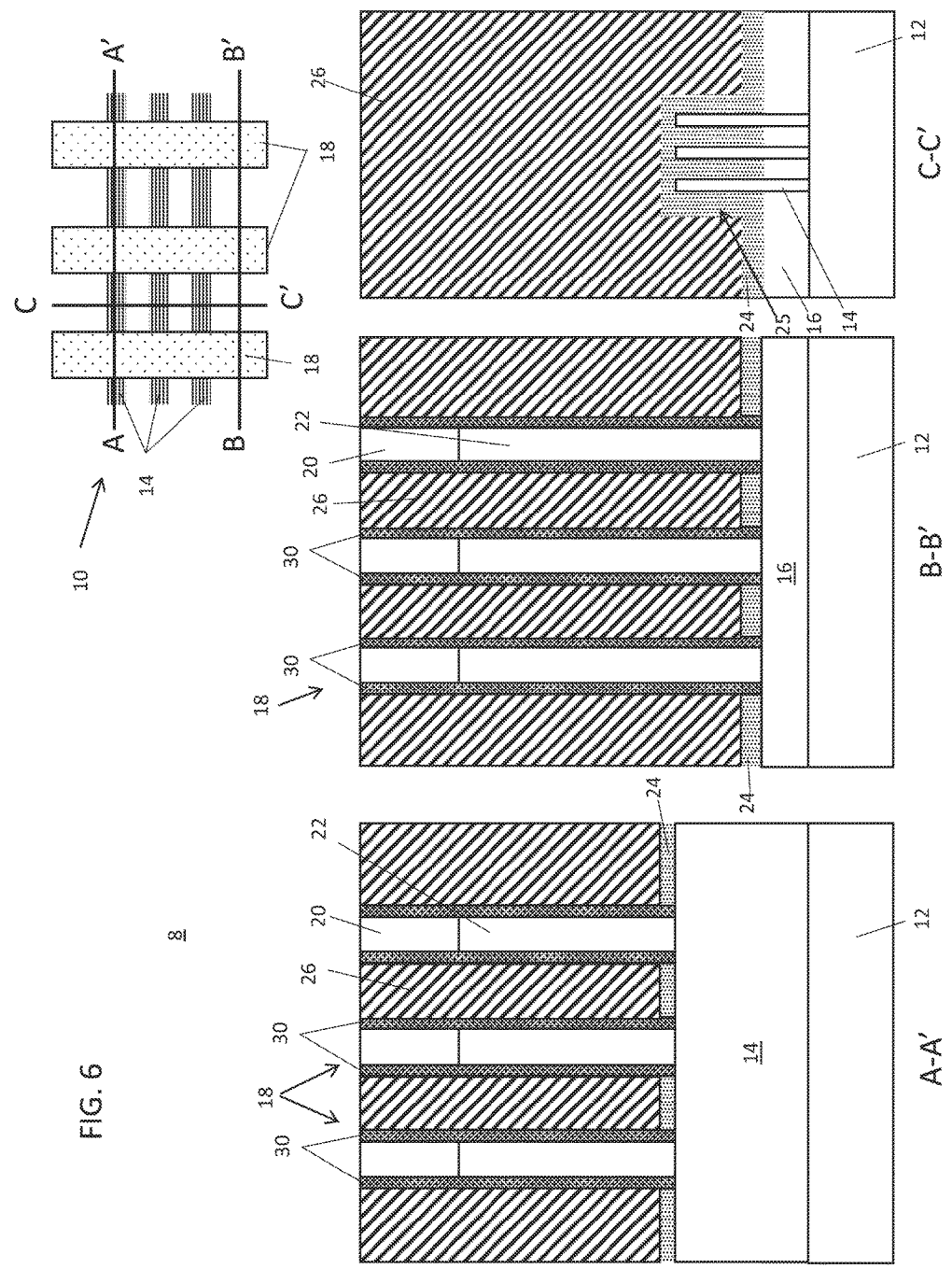
FIG. 6 is a plan view with section lines A-A', B-B' and C-C' and cross-sectional views corresponding to the section lines showing the structure of FIG. 5 with the channels filled with a spacer material to form unipolar spacers in accordance with the present principles.

Referring to FIG. 6, a deposition process is performed to fill in the channel 28 with a dielectric material to form spacers 30. The spacers 30 may be formed from a material having a greater etch resistance than conventional spacers. Conventional spacers often employ SiN. However, in accordance with the present principles a material with a higher etch resistance is employed. In one embodiment, the spacers 30 include SiBCN. In other embodiments, the incorporation of oxygen, boron, or carbon into a SiN may be employed to form SiOCN, SiBCN or other dielectric materials for spacer 30. The spacer layer 30 preferably has an etch resistance greater than that of SiN for oxide removal.

The spacers 30 are formed by a deposition process that may include, e.g., a CVD or ALD process. The materials of the spacers 30 are deposited to completely fill the channels 28 to form the spacers 30 on sidewalls of the gate structures 18. The spacers 30 are vertically disposed only on the sidewalls of the gate structures 18 and not on the fins 14 in section C-C'. The fins 14 remain free from spacers 30 since no channels 28 were formed. Instead, the fins 14 remain protected by the dielectric fill 26. The deposition of spacers 30 forms excess material over a top surface. This excess material may be planarized (e.g., by CMP or etching) to remove it from the top surface.

The spacers 30 are formed without the need for a spacer etch-back process. As a result, less erosion occurs on the fins 14 from etching since the fins 14 are protected by the dielectric fill 26 and/or the dummy spacer 24 during formation of the spacers 30 on the gate structures 18.

The spacers 30 are unipolar spacers formed over the gate structures 18 only, the fins 14 are free from the unipolar spacers 30. The spacers 30 have a substantially uniform thickness formed vertically along the gate structures 18 and may include a spacer material with an etch selectivity greater than SiN for oxide removal. The spacers 30 have a uniform thickness from a top to a bottom of the gate structures 18 since the spacers 30 are formed without an etch back process (which normally erodes a top portion of the spacer) In addition, by employing a material with a higher etch resistance, the shape of the spacers 30 remains intact (uniform thickness) over its entire height.

Figure 7:
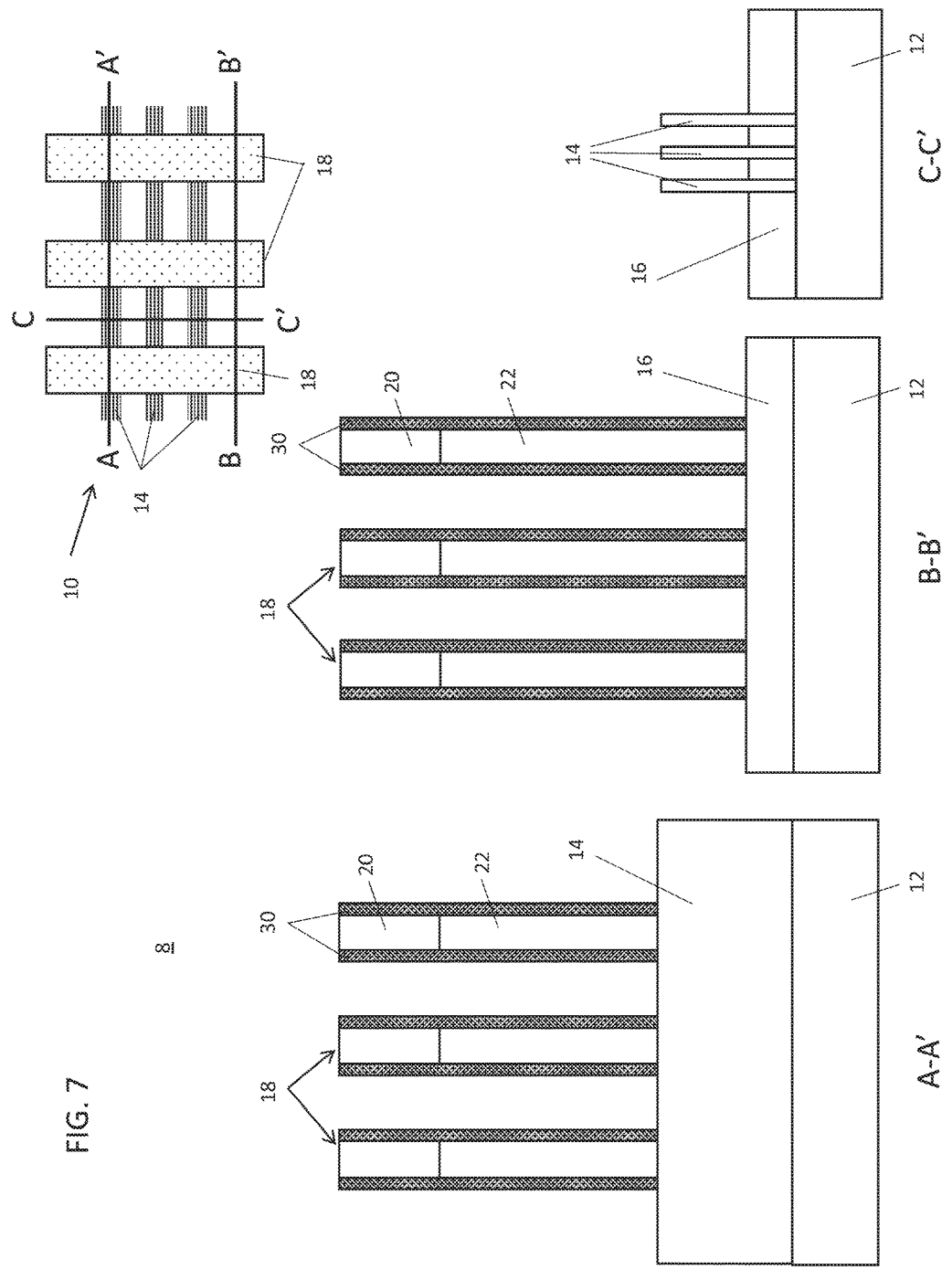
FIG. 7 is a plan view with section lines A-A', B-B' and C-C' and cross-sectional views corresponding to the section lines showing the structure of FIG. 6 with the dielectric fill and the dummy spacer removed to provide pristine fins, no spacer residue at a base of the fins and no gouging of the shallow trench isolation regions in accordance with the present principles.

Referring to FIG. 7, the dielectric fill 26 is removed by a wet or dry etch. Then, the remaining material for the dummy spacer 24 is removed selective to the fins 14, STI 16 and spacers 30. The removal of the dummy spacer 24 from the fins 14 is easier since the pinch-off reduces the amount of dummy spacer material in the crevices at the base of the fins 14 and in between the fins 14. In addition, the material of the dummy spacer 24 is more easily removed due to the etch properties of the dummy spacers versus the fins 14 (e.g., higher selectivity than conventional materials). The removal of the dummy spacers 24 leaves the surfaces of the fins 14 ready for epitaxially cladding. The fins are not damaged by erosion of the previous processing, and no spacer residue is formed about the fins 14 in source and drain (S/D) regions where epitaxial growth will be performed. In addition, the STI region 16 will have also been protected during the spacer formation process which reduces or eliminates gouging (e.g., of STI or other oxide regions) experienced in conventional processing.

Figure 8:
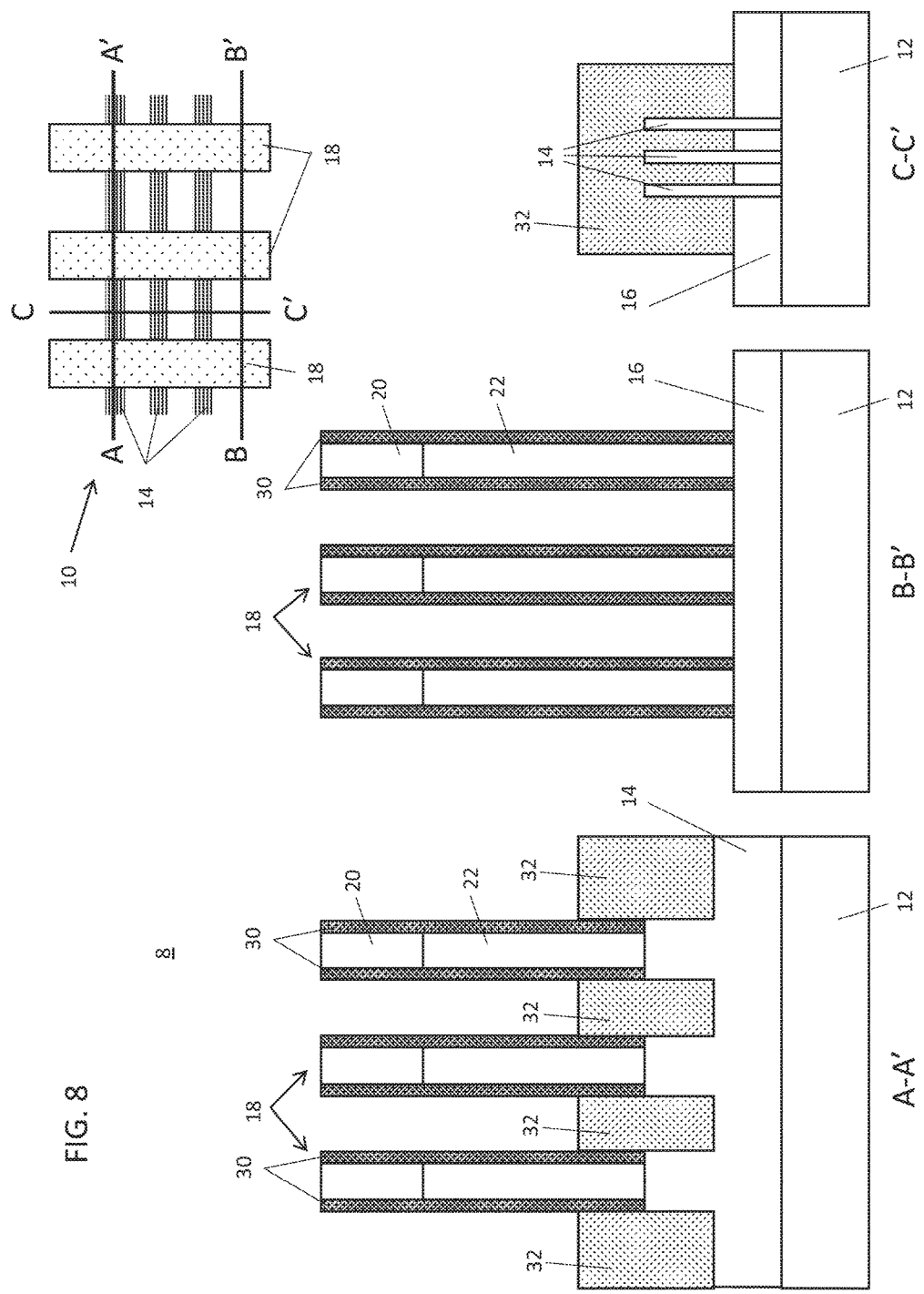
FIG. 8 is a plan view with section lines A-A', B-B' and C-C' and cross-sectional views corresponding to the section lines showing the structure of FIG. 7 having epitaxially grown source and drain regions in accordance with the present principles.

Referring to FIG. 8, exposed portions of the fins 14 between gate structures 18 are prepared for the formation of S/D regions 32. S/D regions 32 are grown on the fins 14 by an epitaxial deposition process.

The epitaxial deposition process can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE), etc. Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from about $1\times10^{19}$ cm$^{-3}$ to about $2\times10^{21}$ cm$^{-3}$, or preferably between $2\times10^{20}$ cm$^{-3}$ and $1\times10^{21}$ cm$^{-3}$. When Si:C is epitaxially grown, the Si:C layer may include carbon in the range of 0.2 to 3.0%. When SiGe is epitaxially grown, the SiGe may have germanium content in the range of 5% to 80%, or preferably between 20% and 40%.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

Processing can continue with dummy gate (22) and hardmask (20) removal (in a gate last procedure) and metal gate fill. A metal gate recess process recesses the gate conductor and forms a dielectric gate cap on top of the gate conductor. An interlevel dielectric layer is formed and planarized, and contacts, metallizations, etc. are formed.

Figure 9:
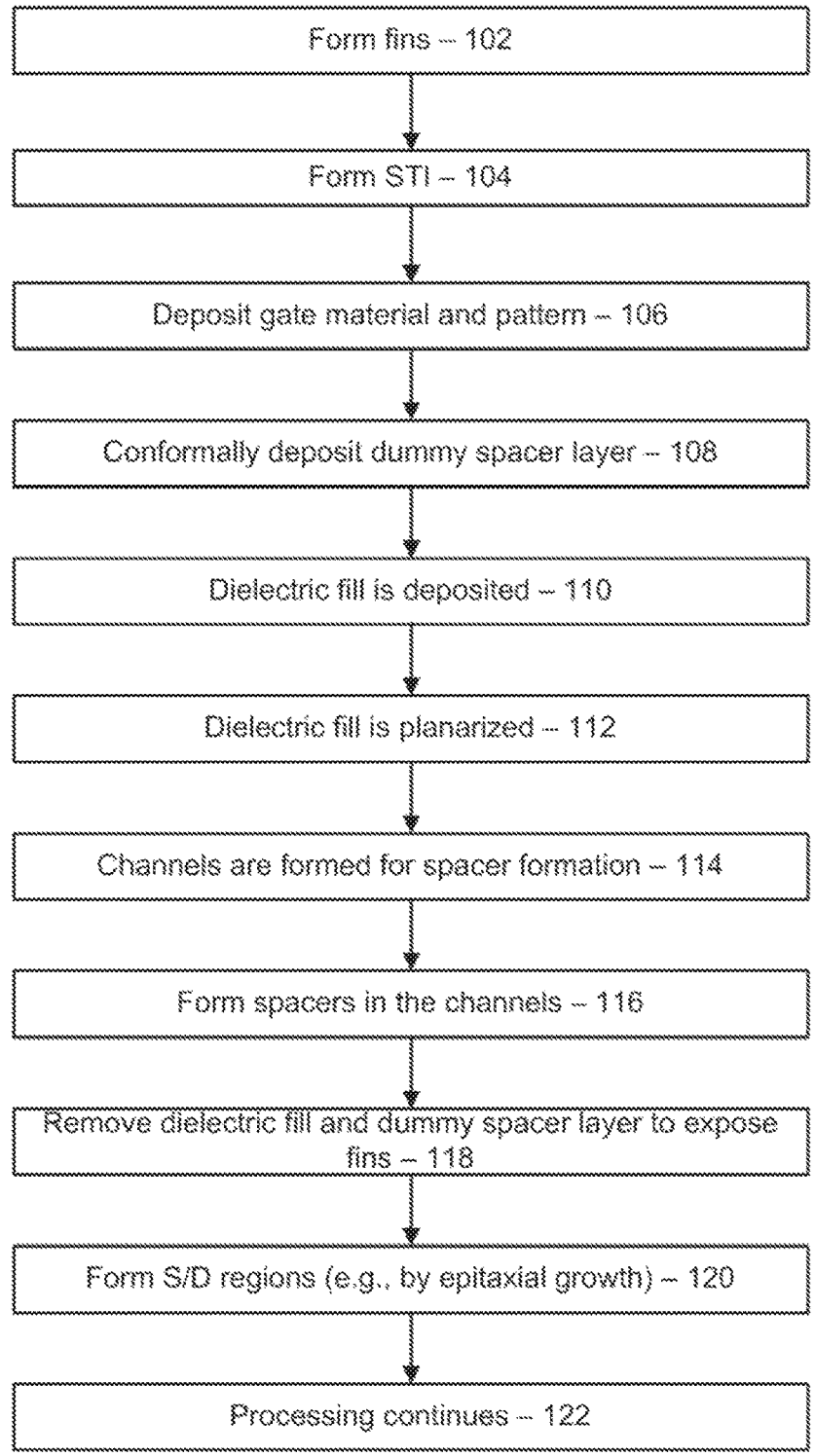
FIG. 9 is a block/flow diagram showing methods for forming a unipolar spacer for a semiconductor device in accordance with the present principles.

Referring to FIG. 9, methods for forming a unipolar spacer for a semiconductor device are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, semiconductor fins are formed by etching a substrate. The substrate may be etched in accordance with a hardmask or patterned mask. Different patterning processes may be employed, e.g., SIT, lithography, SAQP, SADP, etc.). In block 104, shallow trench isolation regions are formed at a base of the fins. This may include a dielectric fill and recess etch or a dielectric fill, CMP and recess etch.

In block 106, gate material is deposited over the fins and patterned in a transverse orientation relative to the fins. The gate material may include dummy gate material (e.g., amorphous silicon or polysilicon) for a gate last (replacement gate) procedure. The gate material may include a gate conductor (and gate dielectric, etc.) for a gate first procedure. In particularly useful embodiments, the fin pitch is less than the gate structure pitch. The methods in accordance with the present principles overcome the difficulties related to the different pitches between the fins and the gate structures since, e.g., the fins remain protected while processing the gate structures.

In block 108, a dummy spacer layer is conformally deposited over surfaces of the gate structures and the fins. The dummy spacer layer may be pinched-off to leave a void remaining at the base of the fins (due to the lower pitch of the fins). The dummy spacer layer may include an amorphous carbon material. The dummy spacer layer may include the formation of a block of dummy spacer material, e.g., due to the close pitch of the fins (pinch-off).

In block 110, a dielectric fill is deposited over the gate structures and the fins. In block 112, the dielectric fill is planarized to remove a portion of the dummy spacer layer formed on tops of the gate structures and expose the dummy spacer layer at tops of the sidewalls of the gate structure. In block 114, channels are formed by removing the dummy spacer layer along the sidewalls of the gate structure, the fins being protected by the dielectric fill. The channels are formed by etching the dummy spacer material from vertical portions of the dummy spacer layer vertically down to the fins and the shallow trench isolation regions.

In block 116, a spacer is formed by filling the channels with a spacer material. The spacer material preferably includes an etch selectivity greater than SiN for oxide removal. In one embodiment, the spacer material includes SiBCN. In block 118, the dielectric fill and the dummy spacer layer are removed to expose the fins. In block 120, source and drain regions are formed between the gate structures on the fins. The source and drain regions may include epitaxially grown semiconductor material.

In block 122, processing continues. This may include the removal of the dummy gate and the formation of a replacement gate, if appropriate. It further includes the formation of interlevel dielectric layers, contacts, metallizations, etc.

Having described preferred embodiments for unipolar spacer formation for finFETs (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
   semiconductor fins formed on a substrate;
   gate structures including a gate material and a hard mask layer formed transversely over the fins, the gate material including a gate conductor and a dielectric gate cap on top of the gate conductor;
   unipolar spacers formed over the gate material and the hard mask layer only, the fins being free from the unipolar spacers, the unipolar spacers having a substantially uniform thickness vertically along the gate structures and including a spacer material with an etch selectivity greater than SiN for oxide removal; and
   source and drain regions formed between the gate structures on the fins.

2. The device as recited in claim 1, wherein the spacer material includes SiBCN.

3. The device as recited in claim 1, wherein the spacer material includes SiOCN.

4. The device as recited in claim 1, wherein the semiconductor fins have a pitch less than a pitch of the gate structures.

5. The device as recited in claim 1, wherein the source and drain regions include epitaxially grown semiconductor material.

6. The device as recited in claim 1, wherein the source and drain regions include a dopant concentration ranging from about $1\times10^{19}$ cm$^{-3}$ to about $2\times10^{21}$ cm$^{-3}$.

7. The device as recited in claim 1, wherein the unipolar spacers are formed directly over the gate structures.

8. The device as recited in claim 1, wherein the semiconductor fins are free of erosion.

9. A semiconductor device, comprising:
   semiconductor fins formed on a substrate, the semiconductor fins being free of erosion;
   gate structures including a gate material and a hard mask layer formed transversely over the fins, the gate material including a gate conductor and a dielectric gate cap on top of the gate conductor;
   unipolar spacers formed over the gate material and the hard mask layer only, the fins being free from the unipolar spacers, the unipolar spacers having a substantially uniform thickness vertically along the gate structures and including SiBCN having an etch selectivity greater than SiN for oxide removal; and
   source and drain regions formed between the gate structures on the fins.

10. The device as recited in claim 9, wherein the semiconductor fins have a pitch less than a pitch of the gate structures.

11. The device as recited in claim 9, wherein the source and drain regions include epitaxially grown semiconductor material.

12. The device as recited in claim 9, wherein the source and drain regions include a dopant concentration ranging from about $1\times10^{19}$ cm$^{-3}$ to about $2\times10^{2}$ cm$^{-3}$.

13. The device as recited in claim 9, wherein the unipolar spacers are formed directly over the gate structures.

* * * * *